United States Patent [19]

Skow et al.

[11] Patent Number: 5,788,425
[45] Date of Patent: Aug. 4, 1998

[54] FLEXIBLE SYSTEM FOR HANDLING ARTICLES

[75] Inventors: Lynn R. Skow, North Branch, Minn.; Arthur R. Moore, Deer Park, Wis.; William M. Dunbar, Cottage Grove, Minn.

[73] Assignee: Imation Corp., Oakdale, Minn.

[21] Appl. No.: 78,380

[22] Filed: Jun. 22, 1993

Related U.S. Application Data

[63] Continuation-in-part of Ser. No. 914,765, Jul. 15, 1992, abandoned.

[51] Int. Cl.$^6$ ........................................ B65G 51/03
[52] U.S. Cl. ........................................ 406/88; 226/97.3
[58] Field of Search ............... 406/84, 86, 87, 406/88; 226/97, 97.1, 97.2, 97.3, 97.4; 414/676, 755, 935, 936, 937, 938, 939, 940, 941

[56] References Cited

U.S. PATENT DOCUMENTS

| | | | |
|---|---|---|---|
| 3,103,850 | 9/1963 | Khoury et al. | 355/76 |
| 3,134,527 | 5/1964 | Willis | 226/97 |
| 3,180,688 | 4/1965 | Futer | 406/88 |
| 3,198,515 | 8/1965 | Pitney | 271/97 |
| 3,231,165 | 1/1966 | Wallin et al. | 226/97 |
| 3,270,933 | 9/1966 | Dekker | 226/97 |
| 3,405,977 | 10/1968 | Albright | 406/84 |
| 3,411,830 | 11/1968 | Smith | 406/88 |
| 3,418,434 | 12/1968 | Groenewegen | 360/130.31 |
| 3,475,058 | 10/1969 | Sanders | 406/88 |
| 3,614,168 | 10/1971 | Range | 406/2 |
| 3,645,581 | 2/1972 | Lasch, Jr. et al. | 406/31 |
| 3,678,216 | 7/1972 | Rousso, Jr. et al. | 360/130.31 |
| 3,705,413 | 12/1972 | Cronquist | 360/88 |
| 3,718,371 | 2/1973 | Lasch, Jr. | 406/88 |
| 3,761,002 | 9/1973 | Baumann et al. | 226/97 |
| 3,890,508 | 6/1975 | Sharp | 250/548 |
| 3,912,144 | 10/1975 | Arseneault et al. | 226/3 |
| 3,918,706 | 11/1975 | Craft | 271/250 |
| 3,976,330 | 8/1976 | Babinski et al. | 406/84 |
| 4,015,880 | 4/1977 | Colvin et al. | 406/88 |
| 4,081,201 | 3/1978 | Hassan et al. | 406/88 |
| 4,144,618 | 3/1979 | Campo et al. | 19/161.1 |
| 4,278,366 | 7/1981 | Loveless et al. | 406/88 |
| 4,299,518 | 11/1981 | Whelan | 406/62 |
| 4,337,885 | 7/1982 | Stahler | 226/97 |
| 4,395,165 | 7/1983 | DeRobertis et al. | 406/88 |
| 4,444,531 | 4/1984 | Baker et al. | 406/88 |
| 4,493,548 | 1/1985 | Ateya | 355/312 |
| 4,525,757 | 6/1985 | Imanishi et al. | 360/130.24 |
| 4,561,806 | 12/1985 | Lenhart | 406/88 |
| 4,568,223 | 2/1986 | Lenhart | 406/88 |
| 4,616,960 | 10/1986 | Gladish | 406/88 |
| 4,710,068 | 12/1987 | Lindstrom et al. | 406/88 |
| 4,732,513 | 3/1988 | Lenhart | 406/88 |
| 4,828,434 | 5/1989 | Fairman et al. | 406/88 |
| 4,978,253 | 12/1990 | Lazzari | 406/88 |

FOREIGN PATENT DOCUMENTS

| | | |
|---|---|---|
| 0 408 021 A1 | 1/1991 | European Pat. Off. . |
| 2.131.976 | 9/1974 | France . |
| 1190063 | 4/1970 | United Kingdom . |
| 1 216 123 | 12/1970 | United Kingdom . |
| 1 288 686 | 9/1972 | United Kingdom . |

OTHER PUBLICATIONS

*Self–Centering Air Lift Transport*, IBM® Technical Disclosure Bulletin, vol. 18, No. 7, Dec. 1975, pp. 2141–2142.

Non–Contact Drying and Turning—The "On Machine" Technology of the Nineties, Edward V. Bowden, pp. 41–46, paper presented at 44th Annual General Conference, Rotorua, 1990.

Primary Examiner—Andrew C. Pike
Attorney, Agent, or Firm—Eric D. Levinson

[57] ABSTRACT

The apparatus for handling and operating on an article includes a flexible member having a working surface and at least one fluid orifice which pass through the flexible member and terminates in outlets on the working surface. The flexible member is a web made of a plurality of stacked layers. Fluid supplied to the working surface through the orifices act on articles placed in close proximity to the working surface.

18 Claims, 11 Drawing Sheets

Fig. 8
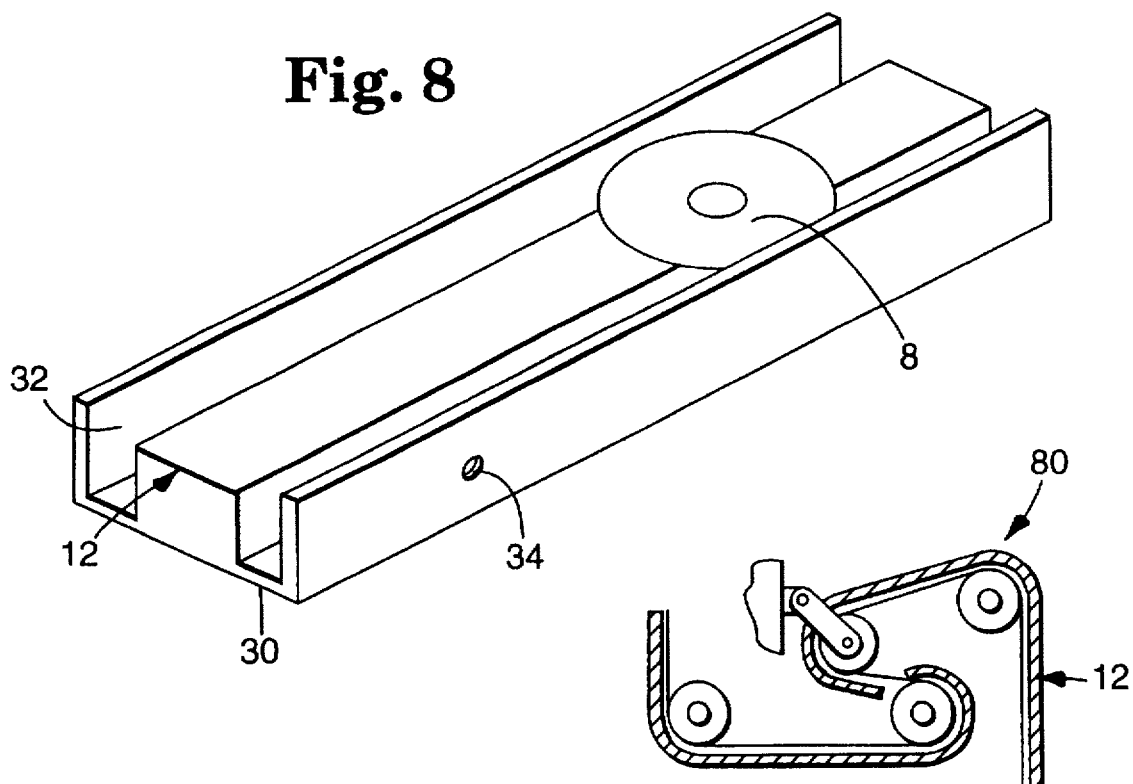
Fig. 9
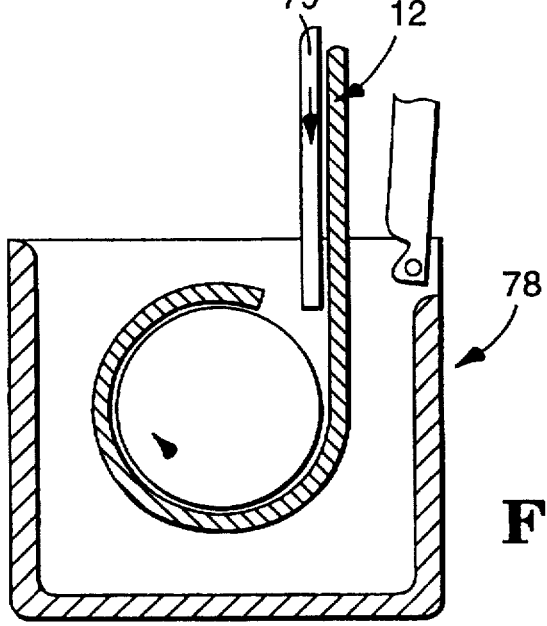
Fig. 10

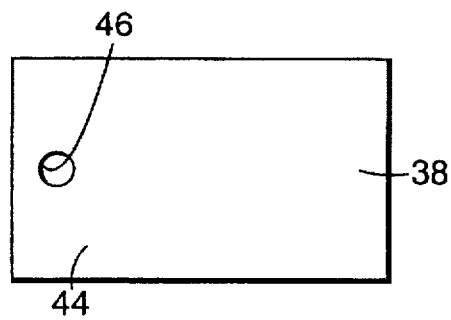
Fig. 19A
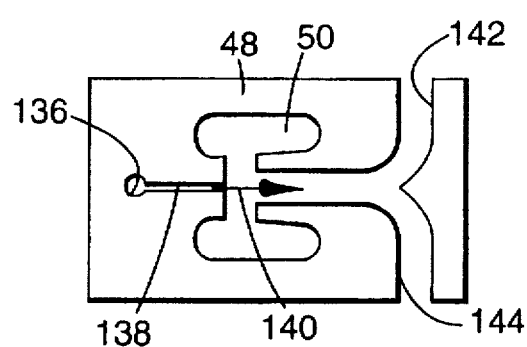
Fig. 19B
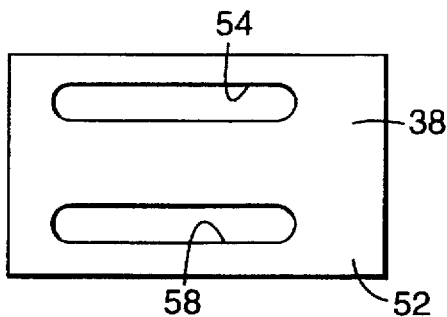
Fig. 19C
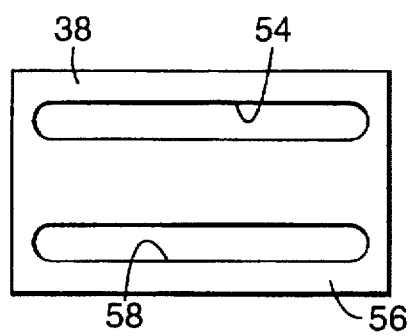
Fig. 19D
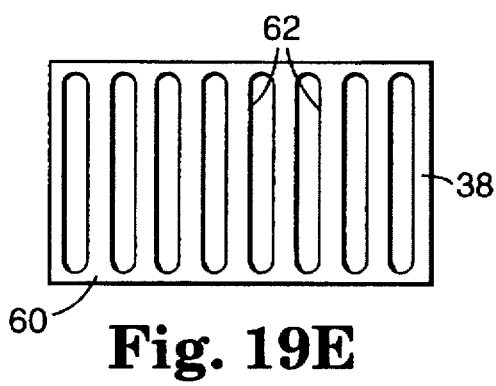
Fig. 19E
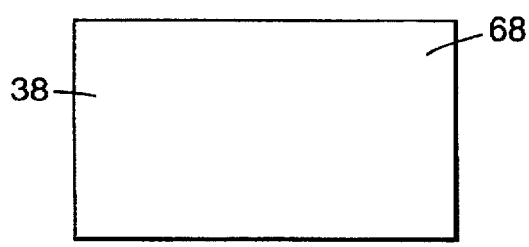
Fig. 19F
Fig. 19G

FLEXIBLE SYSTEM FOR HANDLING ARTICLES

This is a continuation-in-part of application Ser. No. 07/914,765 filed Jul. 15, 1992, now abandoned.

TECHNICAL FIELD

The present invention relates to systems for handling and operating on articles. More particularly, the present invention relates to a flexible system using a fluid for holding, moving, detecting, and operating on articles and for logic and control elements.

BACKGROUND OF THE INVENTION

Many commercially available devices use gaseous and liquid fluids to inspect objects, sense objects, transport material, clamp material, or perform logic functions. Some examples are dimensional air gauges, interruptable jet sensors, air conveyors, machining vacuum chucks, venturi-suction cup combinations, and fluidic logic modules. Many of these devices are fabricated in rigid plastic and metal configurations and are often attached to products and equipment with fasteners, by welding, gluing, or with other rigid attachment methods.

Devices such as air tables and conveyors which provide a cushion of air on which an article can float are well known. However, while the article can float on the air cushion or air bearing, additional external devices or forces must be used to hold, translate, rotate, detect, or otherwise operate on the article.

Transport tables which use directional air jets to transport articles also are known. For example, Hassan et al., U.S. Pat. No. 4,081,201, Loveless et al., U.S. Pat. No. 4,278,366, and DeRobertis et al., U.S. Pat. No. 4,395,165 disclose transporting computer chips and wafers using an air film at low speeds and with the air exiting the system at a large acute angle with respect to the surface along which the chips and wafers are transported. Futer, U.S. Pat. No. 3,180,688, Lasch, Jr. et al., U.S. Pat. No. 3,645,581, Range, U.S. Pat. No. 3,614,168 and Lasch, Jr., U.S. Pat. No. 3,718,371 are representative of patents that disclose various conveyors which use air which exits the system at smaller acute angles less than 30° with respect to the surface along which the articles are transported. Wallin et al., U.S. Pat. No. 3,231,165 discloses an air conveyor for transporting flexible webs which uses outwardly oriented air outlets. This system requires backwardly facing outlets to help stretch taut the webs as well as a segmented surface to exhaust the transport air.

These systems are relatively complex, and simpler and more efficient systems are desired. None of the known systems discloses a fluid transport apparatus which is formed of a plurality of layers and which can be made flexible. None of these systems disclose outlets which can have relatively small length-to-width ratios while ejecting air at small acute angles, and none discloses outlets that create an angular, non-linear, stepped path for the fluid.

There is a need for a flexible system which supports and operates on an article which can act on an article at orientations other than above a horizontal surface. There is also a need to fabricate the above devices in a flexible configuration which can be quickly and effectively attached to products and equipment.

SUMMARY OF THE INVENTION

The present invention is an apparatus for handling and operating on an article. The apparatus includes a member having a working surface and at least one orifice which begins from an inlet, passes through the member, and has at least one outlet on the working surface. Fluid enters the member through the inlet, passes through the orifice, and exits through the outlet.

The member can be a flexible member and can be a web made of a plurality of stacked layers which form a laminate. At least one layer has one or more orifices. The orifices can be oriented to cause the fluid exiting the orifices to create a lower pressure than the ambient pressure between the article and the working surface to cause the article to be held on the working surface.

A fluid source is connected to the orifice inlets. The fluid passing through the orifices operates on an article on the working surface. This operation could simply be holding the article in place on the working surface. Alternatively, the operation could include transporting the article along or rotating the article on the working surface by selectively directing and shaping the outlets of the orifices. In other alternative embodiments, the apparatus can serve as fluidic logic elements or as inspection transducers, or can be used to sense the presence of an article. Additionally, the apparatus can be used to convert an existing surface into a system for handling and operating on an article with minimal increase in the thickness of the existing surface.

BRIEF DESCRIPTION OF THE DRAWINGS

FIG. 8 is a perspective view of a transport track incorporating the apparatus of FIGS. 1A, 1B, and 1C.

FIG. 9 is a cross-sectional view of a tape winder incorporating any of the apparatus of FIGS. 1A, 1B, 1C, and 2.

FIG. 10 is a cross-sectional view of another tape winder incorporating any of the apparatus of FIGS. 1A, 1B, 1C, and 2.

FIGS. 19A–19G are top views of layers used to form the apparatus of the embodiment of FIG. 16. FIG. 19A shows the first layer 44, an inlet layer. FIG. 19B shows the second layer 48, a venturi layer. FIG. 19C shows the third layer. FIG. 19D shows the fourth layer. FIG. 19E shows the fifth layer. FIG. 19F shows the sixth layer. FIG. 19G shows the seventh layer.

FIG. 22 shows the member used for dimensional air gauging and FIG. 23 shows the member used for gauging a surface finish.

FIG. 24 which depicts decorative tape being applied to a product and FIG. 25 shows the adhesive layer facing the member.

FIG. 26A shows an article sensor without an object and FIG. 26B shows the sensor near an object. FIG. 27A shows an article sensor without an object and FIG. 27B shows the sensor near an object. FIG. 28 shows a cross-fire sensor.

DETAILED DESCRIPTION OF PREFERRED EMBODIMENTS

Figure 16:
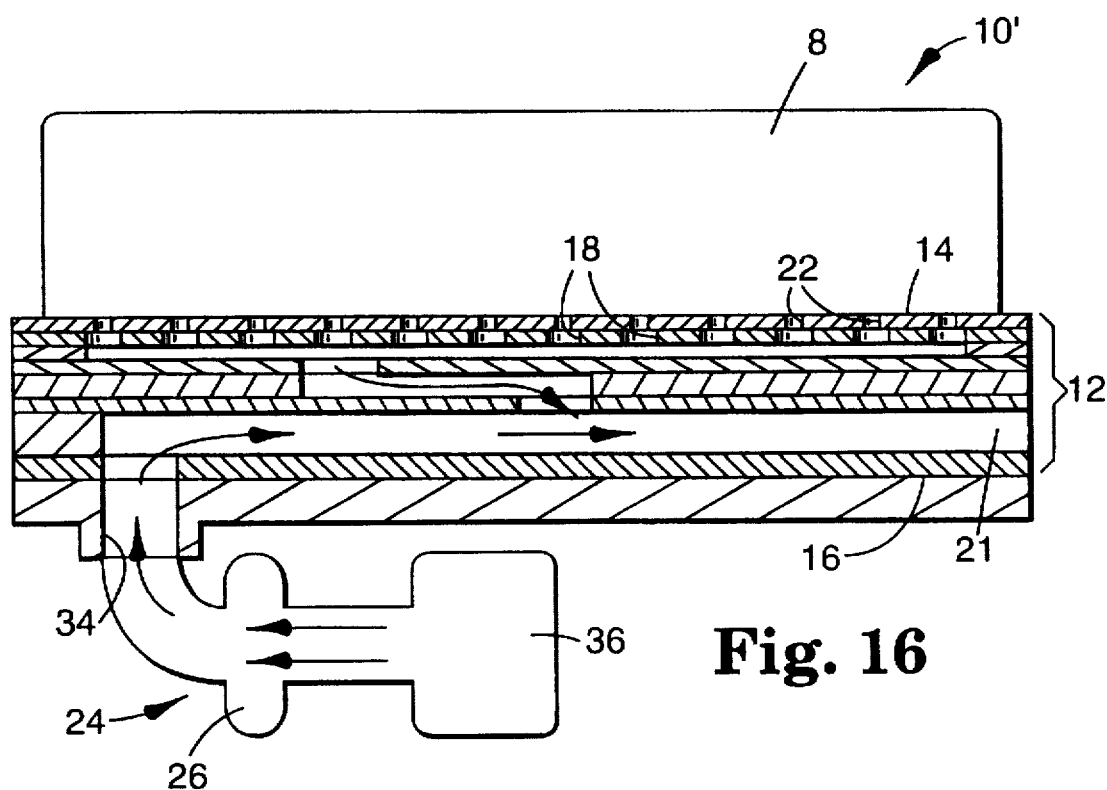
FIG. 16 is a cross-sectional view of an apparatus for operating on an article according to another embodiment of the present invention configured to hold an article.

The system 10 handles and operates on an article 8 and can be easily adhered to an existing surface. The system 10 can operate with various working fluids although illustrated embodiments are described as using air. As shown in the Figures, the system 10 includes a member, which can be flexible or rigid, and which is described and shown as a flexible member 12 having a working surface 14 and an opposing bottom surface 16. At least one orifice 18 begins from at least one inlet 34, passes through the flexible member 12, and has outlets 22 on the working surface 14. Fluid, such as air, water, inert fluorocarbons, and various other gases and gas mixtures, enters the flexible member 12 through the inlet 34, passes through the orifice 18, and exits through the outlets 22. In embodiments involving contact of the article 8, such as shown in FIG. 16 and described below, the orifice 18 continues past the outlet 22 to create suction.

The outlets 22 are the outlet for a conduit assembly 24 which is in fluid communication with the inlet 34 through the orifice 18. Fluid from each outlet 22 exits the flexible member 12 at a predetermined angle and direction selected in combination with the desired function of the system 10. Fluid exiting the outlets 22 flows between the working surface 14 and the article 8 and the fluid flow direction from individual outlets 22 can vary from the directional path of the article 8.

Figure 1A:
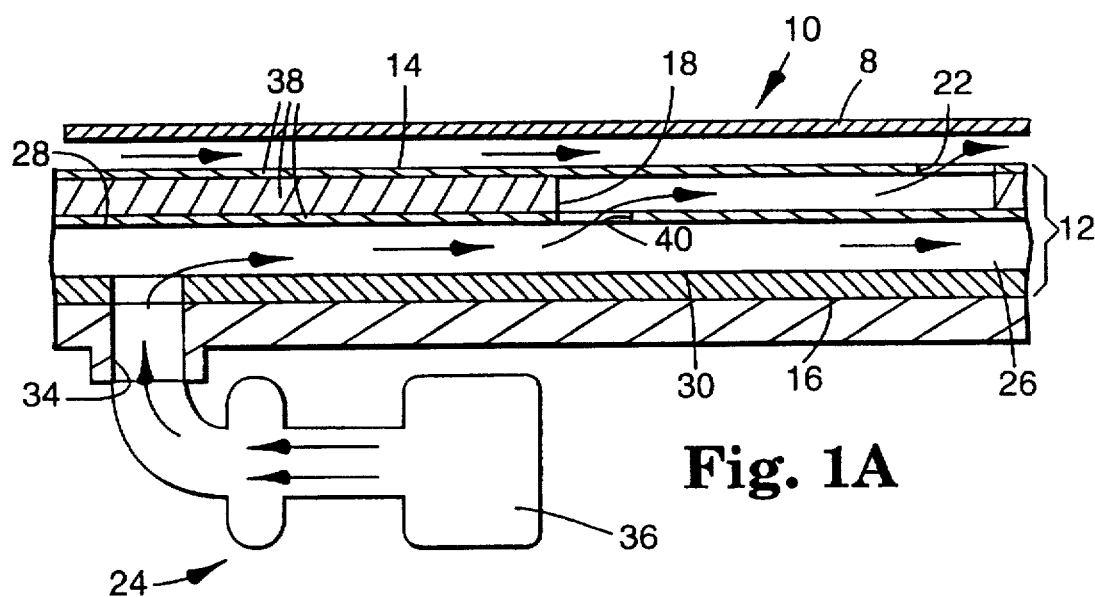
FIG. 1A is a cross-sectional side view of an apparatus for operating on an article according to an embodiment of the present invention configured to hold or transport an article.
Figure 1B:
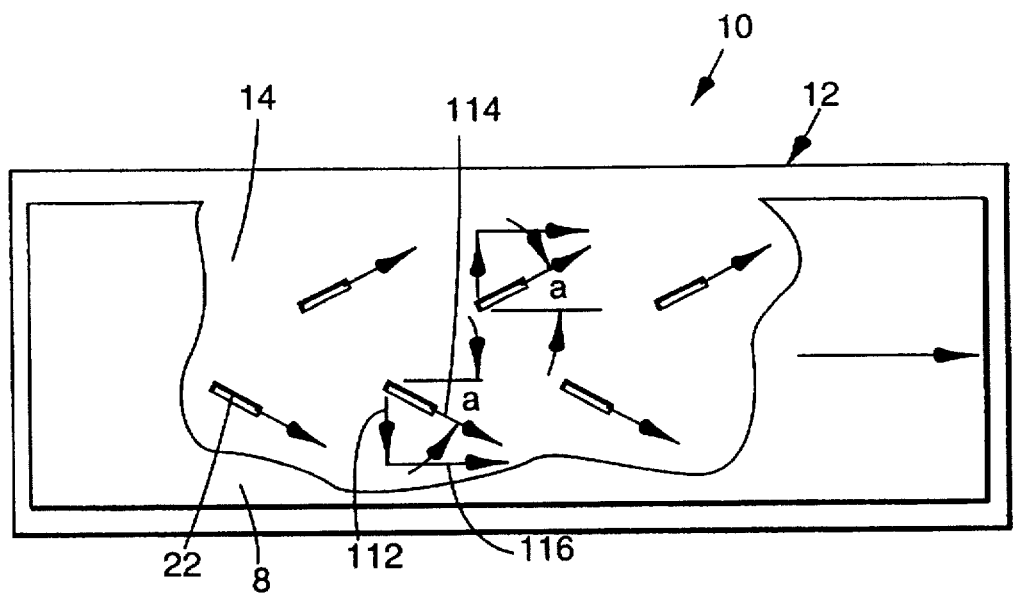
FIG. 1B is a top view of the apparatus of FIG. 1A.
Figure 1C:
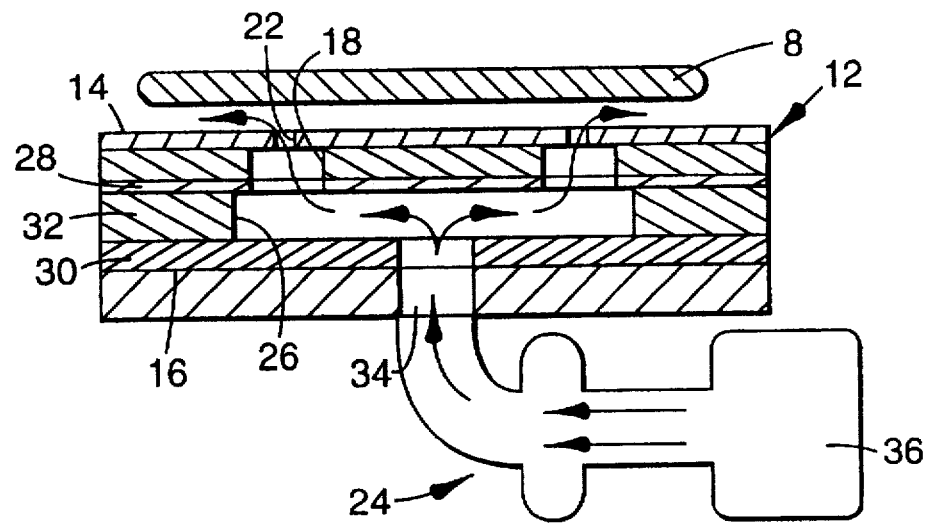
FIG. 1C is an end cross-sectional view of the apparatus of FIG. 1A.

The conduit assembly 24 includes a supply manifold 26 which can be formed as part of the flexible member 12, as shown in the Figures, or mounted to the bottom surface 16 of the flexible member 12. In FIG. 1C, the supply manifold 26 includes a channel defined by a top wall 28, a bottom wall 30, and side walls 32. The inlet 34 introduces fluid into the supply manifold 26 for distribution through the orifices 18 and outlets 22. A fluid source 36 is connected to the inlet 34. The fluid source 36 can be a compressor which supplies air under pressure to the conduit assembly 24. The pressurized air exits through the outlets 22 in a jet-like flow against the article 8. The alternative embodiment of FIG. 2 does not use the supply manifold 26. Instead, a flexible member 12 is mounted directly to a pressure vessel or plenum chamber 37 with inlets 34 communicating with the orifices 18 and outlets 22 in the flexible member 12.

The fluid passing through the orifices 18 handles and operates on an article 8 on the working surface 14. The operation can be varied by changing the system characteristics. Selecting the pattern, direction, angle, shape, and length of the outlets 22 and the thickness of the layers 38 in combination with the fluid pressure and the article properties determines the operation. Particularly, the operation can be altered by changing the angle a, shown in FIG. 1B, at which the fluid exits the outlets 22. The directional component 116 of the air flow contributes to both the pressure differential and transport of the article 8 while the cross-directional component 112, perpendicular to the directional component 116, contributes only to pressure differential. The cross-directional component 112 and the directional component 116 combine to yield the flow direction 114. When the fluid exits with no cross-directional component 112 the system 10 transports articles 8 with less pressure differential than if there were a cross-directional component. When the fluid exits with some cross-directional component 112, the system 10 transports articles 8 with increased pressure differential. When the fluid exits with no directional component 116, the system 10 holds articles 8 with no transport.

The jet-like air flow exiting the orifices 18 through the outlets 22 creates a controllable gap between the working surface 14 of the flexible member 12 and a bottom surface of the article 8. The gap is established by balancing and maintaining equilibrium among the forces, including gravity, on the article 8.

According to the Bernoulli principle, as the air velocity increases, its pressure is reduced from that of the surrounding fluid moving at a lower velocity. The velocity difference causes a pressure difference. An object placed between the high and low velocity fluid will tend to be forced toward the higher velocity fluid until equilibrium is reached. Where a uniform fluid flow is forced between a stationery working surface and a movable object, a uniform force will be exerted on the object toward the working surface. The object will not contact the working surface if the object has an area-to-weight ratio large enough so that the force from the air jets exceeds the gravitational and other forces, and the product of the surface area of the article and the pressure between the article and the working surface must exceed the weight of the article.

Figure 3:
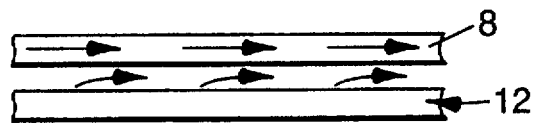
FIG. 3 is a schematic view of a horizontal, one-dimensional, transport path.
Figure 4:
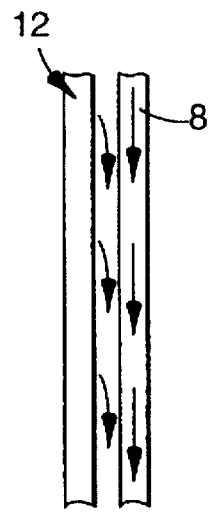
FIG. 4 is a schematic view of a downwardly vertical transport path.
Figure 5:
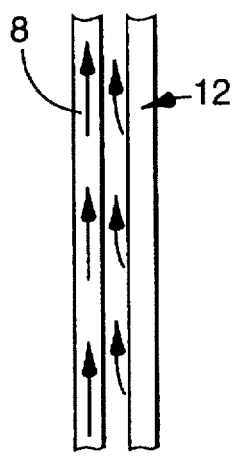
FIG. 5 is a schematic view of an upwardly vertical transport path.
Figure 6:
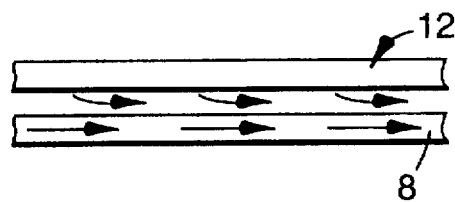
FIG. 6 is a schematic view of an upside-down, horizontal, one-dimensional transport path.

As long as the fluid flow is uniform and the article 8 has a sufficiently large area-to-weight ratio, a uniform pressure is exerted on the article toward the working surface. Minimum area-to-weight ratios of $2.94 \times 10^{-4}$ cm²/N are preferred, although an approximately $9.81 \times 10^{-6}$ cm²/N ratio is acceptable for atmospheric applications. Therefore, the system 10 can operate when the flexible member 12 and the article 8 are horizontal with the article 8 on top of the working surface 14 of the flexible member 12 (FIG. 3), as well as vertical (FIGS. 4 and 5), with the article 8 underneath the working surface 14 of the flexible member 12 (FIG. 6), or at any orientation along the 360° circle of positions. The system 10 is orientation independent.

The flexible member 12 preferably is a web. At least one layer 38 has one or more orifices. In a typical embodiment, three layers 38 are used: a first layer through which the fluid enters, a second layer which establishes the direction of the fluid, and a third layer through which the fluid exits. The layers 38 can be as thin as, for example, about 0.01 mm and can be any flexible material. The layers 38 can be joined or laminated by bonding, welding, or using adhesives. Also, the layers 38 can simply be pressed together without bonding. The layers 38 can be pre-laminated with an adhesive on the outermost bottom layer and the flexible member 12 can be attached like adhesive tape to a mounting surface which has ports to communicate with those in the bottom of the flexible member 12. A release layer, such as silicone treated paper, may optionally be included to facilitate storage and unwinding of the article.

The layers 38 can be formed of plastics, metals, ceramics, or composite materials. To prevent static charge build-up on the working surface 14, the working surface 14 can be metallic or conductive plastic. Additionally, the transport fluid can be ionized to facilitate the transport of materials that might involve static charge build-up. The openings 40 in each layer 38 can be formed by any known method including punching, drilling, or stamping. The openings 40 can be perpendicular to or at acute angles with the surface of the layer. Also, the orifices 18 formed when the layers 38 are stacked need not be straight or linear and can have any desired shape. Outlets with areas less than 0.0036 cm² have been fabricated. Air supplied at $4.25 \times 10^{-2}$ m³/min (1.5 cfm) and 13790 Pa (2.0 psi) to these outlets transport articles at 760 cm/s.

As is shown in the Figures, the outlet can create an angular, nonlinear, stepped path for the fluid and the outlet area can have any shape. It could be rectangular, round, oval, or any regular or irregular polygon and need not be dictated by the formula for commonly drilled holes with a circular cross section bit when drilling at an acute angle with the plane of the working surface. These bits form an outlet at the working surface having an oval cross section with a length-to-width ratio governed by the drilling angle a as expressed in the equation $l/w = 1/\sin a$. Length-to-width ratios much less than dictated by the formula can be achieved in the present invention. Thus, the outlet 22 can extend through the working surface 14 to deliver fluid to the working surface at an effective angle of less than 20° with an outlet having a length-to-width ratio less than 2.9. Thus, for example, the effective angle can be less than 15° and the length-to-width ratio less than 3.8, the effective angle can be less than 10° and the length to width ratio less than 5.7, and the effective angle can be less than 5° and the length to width ratio less than 11.4.

Figure 7A:
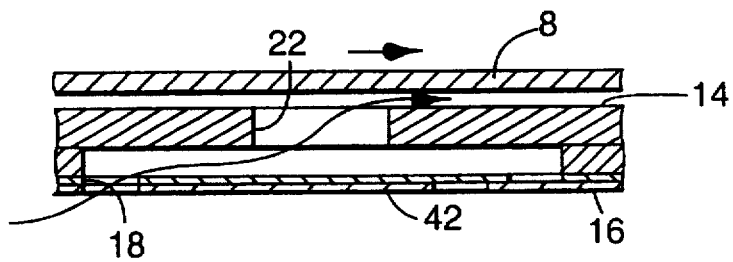
FIGS. 7A and 7B are cross-sectional views of an apparatus for handling and operating on an article according to another embodiment of the present invention configured to transport an article in two directions with FIG. 7A showing transport in one direction and FIG. 7B showing transport in the other direction.
Figure 7B:
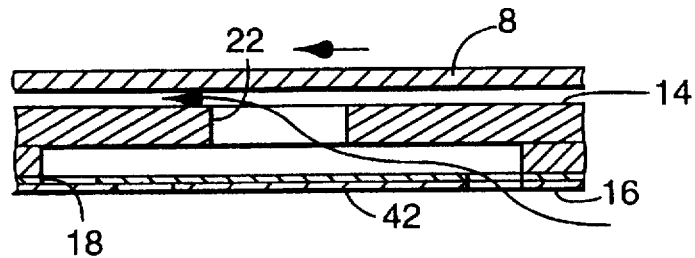

In a modification shown in FIGS. 7A and 7B, a movable wiper lamination layer 42 can open and close the orifices 18 to turn on and off the fluid jets passing through the orifices. The wiper lamination layer 42 also can reverse the direction of fluid flow through the orifices 18. As the wiper lamination layer 42 moves from the position in FIG. 7A to that in FIG. 7B, the fluid inlet is switched to change the fluid jet direction.

Figure 13:
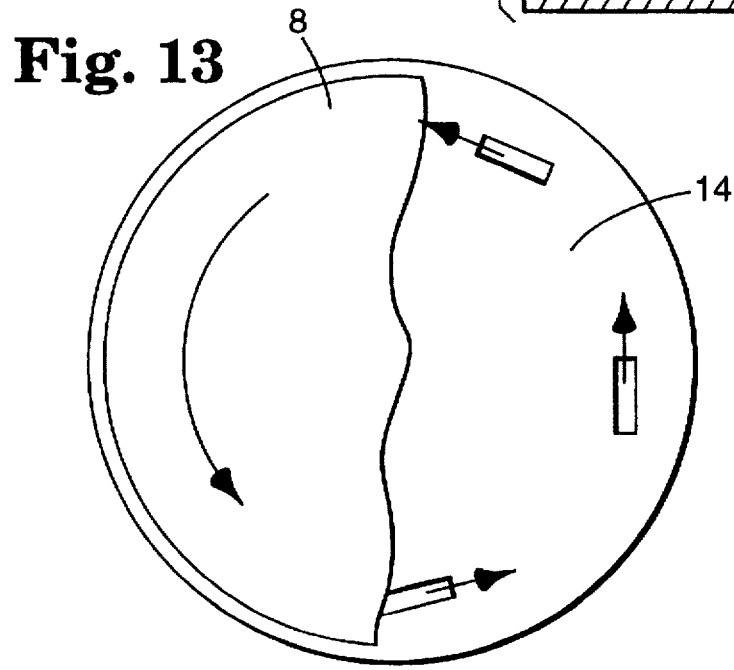
FIG. 13 is a top view of the apparatus of FIG. 12.
Figure 14:
FIG. 14 is a schematic view of a curved, two-dimensional transport path.
Figure 15:
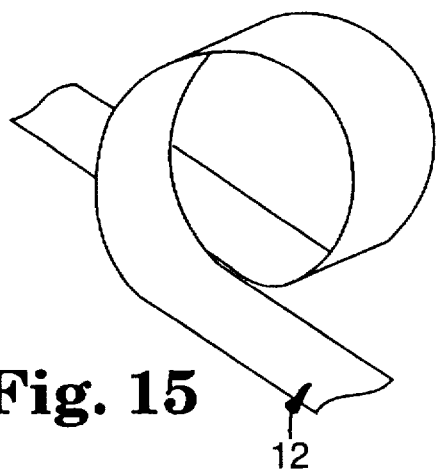
FIG. 15 is a schematic view of a helical, three-dimensional transport path.

The system 10 has numerous uses. The operation includes moving or holding an article 8 without contacting the article as illustrated in FIGS. 1A, 1B, and 1C, 2, and 8–13. The article is simply transported without contact. The transport of high area-to-weight ratio articles 8 is accomplished while holding the article adjacent the working surface 14. The system 10 can transport disks, such as shown in FIG. 8. Similarly, the system 10 can be used to pick up an article 8, such as a disk, without contacting the article, and transporting the article to another location at which a separate system 10 can receive the article without contact. This transportation can be accomplished either by using the fluid streams of the system 10 or, conventionally, by physically moving the system 10 itself. The system 10 transports webs such as tapes, which are compliant and have a high area-to-weight ratio, by threading and winding the tape ends through a tape winding apparatus or end product such as a cassette. The jet-like air flow exiting the outlets 22 supports the article 8 and has sufficient force to move the article 8 in the direction of the ejected air. The article 8 is held adjacent the flexible member 12 regardless of the working surface 14 orientation. Transport paths are two or three-dimensional, as shown in FIGS. 14 and 15.

Figure 12:
FIG. 12 is a partial cross-sectional view of another embodiment of an apparatus for operating on an article configured to rotate an article.

An acute angle b relative to the working surface 14 as shown in FIG. 12, which rotates an article 8, is preferred. When used to transport articles 8, minimizing this angle and the fluid flow component perpendicular to the working surface 14 maximizes the component of fluid flow in the direction of travel.

Figure 11:
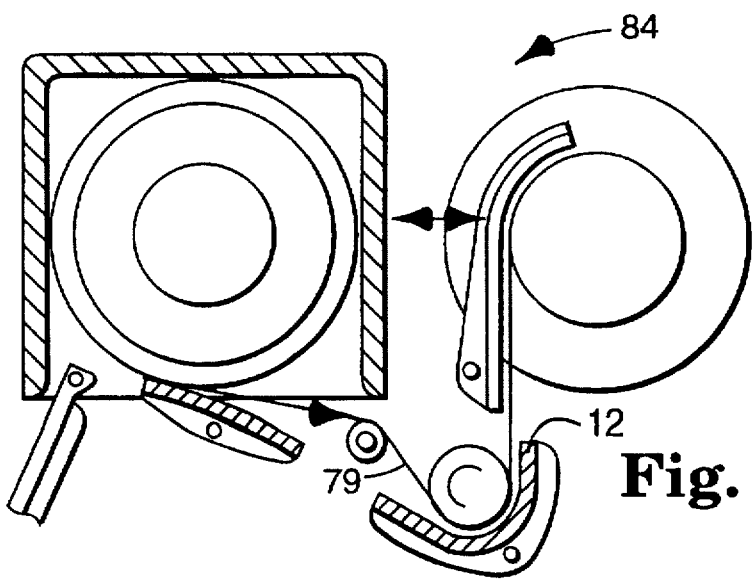
FIG. 11 is a cross-sectional view of another tape winder incorporating any of the apparatus of FIGS. 1A, 1B, 1C, and 2.

The system 10 has been used with tape winders 78 and tape threaders 80, shown in FIGS. 9–11. The tape 79 will not contact the flexible member 12 around bends due to the small outlet construction. For example, as shown in FIG. 9, the flexible member 12 has been used to thread movie film 81, supplied to the flexible member 12 from a supply reel, through a projector's film path. After threading, stopping the air flow through the outlets 22 allows the film 81 to be used for projection. Similar principles have been applied to the use of the system 10 with data, video, and audio magnetic and optical tapes 79. The flexible member 12 has been used to thread new reels of tape 79 into winders 78, as shown in FIG. 10. The flexible member 12 enables the tape 79 to be wound onto a reel without a leader. Also, as shown in FIG. 11, the system has been used with single reel cartridges 84 to transport the tape 79 and connect the cartridge reel to the resident drive reel with the flexible member 12. Several flexible members 12 can be used together to transport wide tapes and webs. Gaps between adjacent flexible members 12 can serve as vent passages for the transport fluid.

In another example embodiment, the transport system is formed of a layered construction using three layers. (All dimensions are approximate.) The first layer is 0.4 mm thick and is made of a vinyl material with adhesive on one side to adhere to the second layer. The second layer is 0.4 mm thick and also is made of a vinyl material. The second layer can have adhesive on both sides to adhere to the first and third layers. The third layer is 0.1 mm thick and is made of stainless steel. The working surface formed on the third layer is 25 mm wide. This transport system has two arrays of orifices and two arrays of outlets are formed in the working surface. The outlets are rectangular and have a width of 1.0 mm and length of 5.0 mm. The outlets are oriented at an angle with respect to a centerline of the working surface of 30°. The outermost portion of the outlets (from the centerline) is 3.5 mm from the side edge of the working surface, 14.0 mm from corresponding outlets on the other side of the centerline, and 12.0 mm from the outermost portion of the adjacent outlet on the same side of the centerline. The outlet creates an angular, nonlinear, stepped path for the fluid. This path causes fluid to exit the outlet at a 1° angle with the working surface. This angle is defined as the angle formed between the diagonal line connecting the lower left and upper right corners of the outlet formed in the third layer and the working surface. (The third layer is 0.1 mm thick and the outlet length is 5 mm.)

A transport system 27 cm long formed in a loop and having 45 outlets was used to transport a flexible tape which was 25.4 cm long, 2.54 cm wide, 25.4 microns thick, and was 0.22 grams. The air mass flow rate entering the inlet in the first layer ranged from 0.0006 kg/sec to 0.0010 kg/sec (the air velocity ranged from 27 m/sec to 235 m/sec with the directional component ranging from 23 m/sec to 204 m/sec). This produced an air velocity at the outlet of up to 300 m/sec transported the article at speeds of up to 1650 cm/sec.

The flexible member 12 can provide high velocity noncontact transport of die-cut flexible disks when extracting the disk from presses after die-cutting. Moreover, the air transport system removes loose debris. Support of the disk adjacent the working surface 14 allows the disk to be transferred from one flexible member 12 conveyer to another for changing containers or article collection. By using both forward-propelling and reverse-propelling outlets 22, curl of the punched disk is reduced as a function of the pressure differential.

A variation of transporting is rotating the article 8 on the working surface 14. This is shown in FIGS. 12 and 13. Articles such as magnetic or optical disks with a conventional or non-conventional form factor have been used. Credit card-shaped media have been rotated and round media within credit card-shaped jackets can be rotated. Additionally, the system has been used as an air drive, with abrasive films to provide light sanding or polishing heads.

Figure 17:
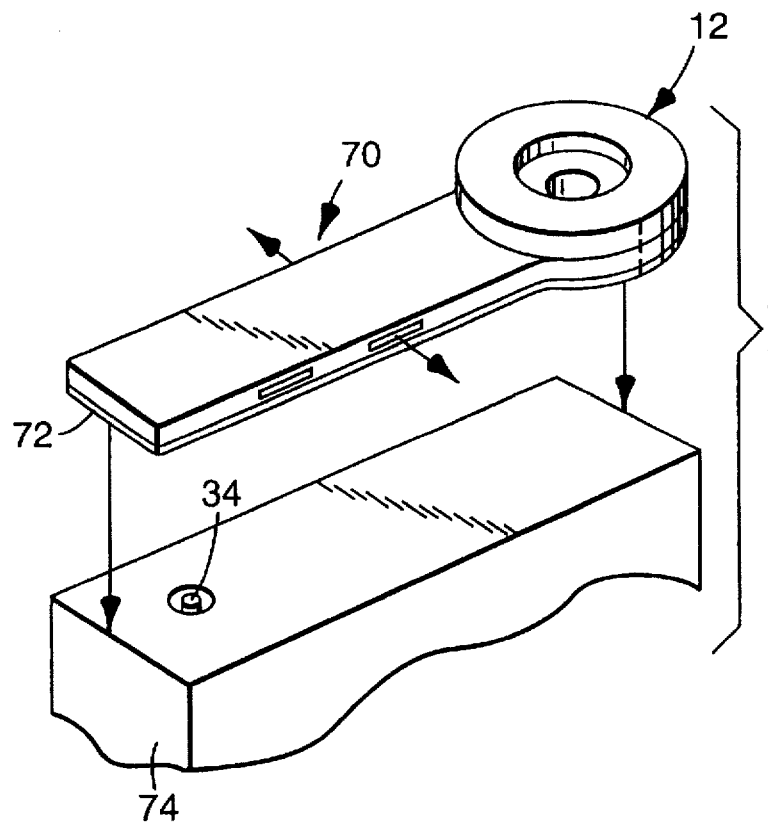
FIG. 17 is a perspective view of a suction cup incorporating the apparatus of FIG. 16.
Figure 18:
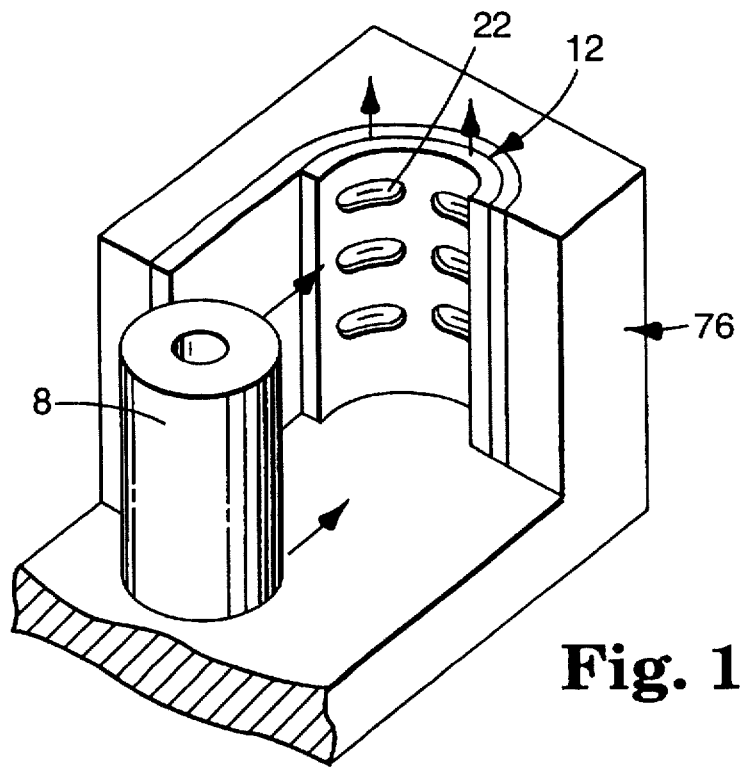
FIG. 18 is a perspective view of a process clamp incorporating the apparatus of FIG. 16.

Alternatively, in a contact/hold-down embodiment, as shown in FIGS. 16–18, the system 10' has been used to orientation independently hold an article 8 in place on the working surface 14 while contacting the article 8. In this embodiment, after contact and establishing a vacuum, none of the fluid passes through the outlets 22 on the working surface 14. The fluid passes through the orifices 18 initially and exits through additional passages which serve as a vent 21. The combination of orifices 18 and vent 21 forms a complete path connected to the fluid source 36 and the resulting suction holds the article 8 against the working surface 14. The system 10' can be a suction cup 70, as shown in FIG. 17, used to handle paper and components, and in part feeding applications. The suction cup has been adhered to a support block 74 using an adhesive layer 72. The system 10' also has been used as a process clamp 76, shown in FIG. 18, to hold parts for process operations. The flexible member 12 lines the walls of the process holding fixture. Also, a vacuum chuck using the system 10' can hold nonmagnetic materials for milling, grinding, and engraving.

FIGS. 19A–19G illustrate the layers 38 of the flexible member 12 configured for contact holding using vacuum as described with respect to FIGS. 16, 17, and 18. This embodiment uses a venturi layer to generate a partial vacuum. The first layer 44, shown in FIG. 19A, is the inlet layer and includes an opening 46 which serves as the inlet 34. The second layer 48, shown in FIG. 19B, is a venturi layer and includes an opening 50 which generates a partial vacuum.

Air enters the venturi layer 48 at 136, passes through the nozzle portion 138 and gap 140, and exhausts at vents 142 and 144. The flow exiting the nozzle portion 138 reduces pressure in the gap 140. This low pressure is distributed through the remaining layers 52, 56, 60, 64 to the working surface layer 68.

The third and fourth layers 52, 56, shown in FIGS. 19C and 19D, respectively, include elongate openings 54, 58 which are generally oriented to distribute the air in the direction of flow. The fifth layer 60, shown in FIG. 19E, includes elongate openings 62 which direct the air to the outlets 22. The sixth layer 64, shown in FIG. 19F, includes openings 66 which serve as the outlets 22 through which the air exits the orifices 18 formed by the openings 50, 54, 58, 62. The seventh layer 68, shown in FIG. 19G, is the porous, nonwoven working surface layer and covers and protects the flexible member 12 from debris. The nonwoven web distributes the partial vacuum uniformly across the working surface 14 and permits fragile, highly polished, or cosmetic parts to be held for transport during manufacturing processes without damage. A plurality of independent laminate constructions as previously described has been assembled into an array of elements. Test partial vacuums have exceeded about $4.8 \times 10^4$ pascal. In alternative embodiments, a vacuum source has been coupled to the layers 52, 56, 60, 64 to attain similar holding benefits.

Figure 20:
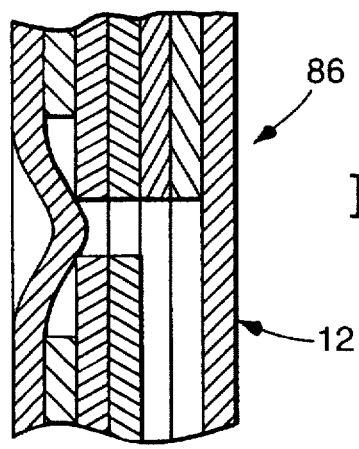
FIG. 20 is a cross-sectional view of an apparatus according to another embodiment of the present invention configured to provide a flexible pneumatic switching article.
Figure 21:
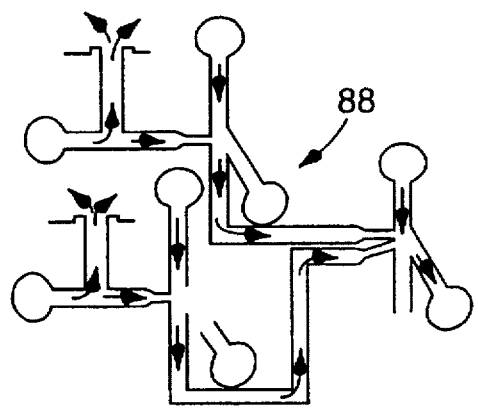
FIG. 21 is a schematic view of a flexible fluidic logic element incorporating apparatus to provide a logic and control function.

In another operation of the system 10, the orifices 18 can be oriented to serve as fluidic switches 86, shown in FIG. 20, or logic elements 88, shown in FIG. 21. The membrane switches can be made with materials similar to those used in electronic membrane switches such as PET and the like. The switches can be used to pilot air valves or to provide a logic and control function.

Figure 22:
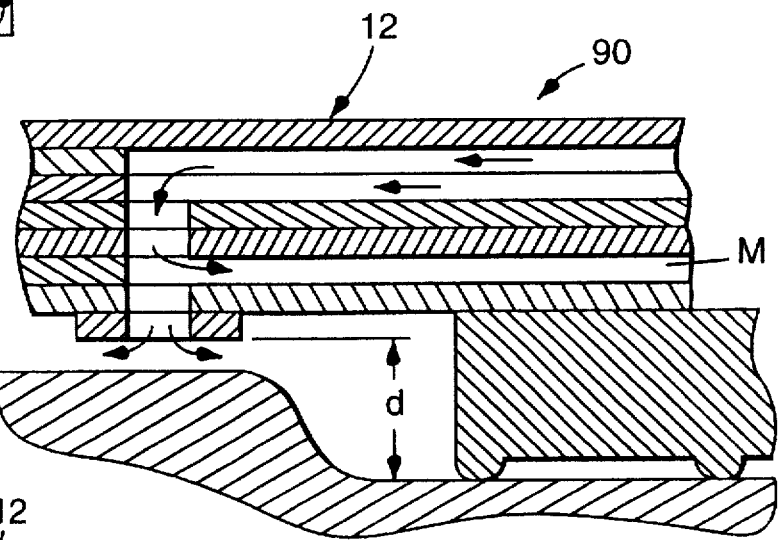
FIGS. 22 and 23 are cross-sectional views of apparatus according to another embodiment of the present invention configured to serve as flexible inspection transducers.
Figure 23:
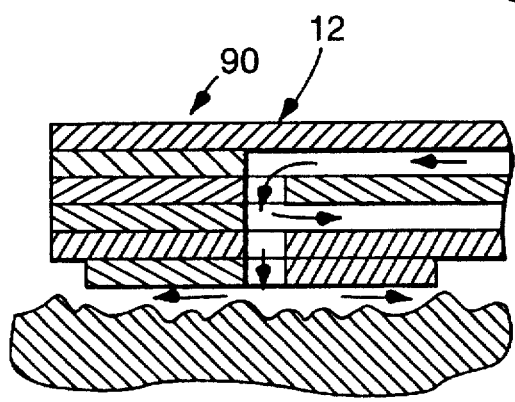

The system 10 also has served as inspection transducers 90, as shown in FIGS. 22 and 23. In FIG. 22, the flexible member 12 is used for dimensional air gauging. When the distance from an article to an outlet is less than one third of the diameter of the outlet, the pressure measured in the outlet is proportional to that distance. As the distance d decreases, flow from the outlet decreases, resulting in an increase in the pressure measured at M. In FIG. 23, the flexible member 12 is used for gauging a surface finish. The surface roughness of the material being tested acts as a flow restrictor. A rough microfinish creates turbulence, reduces the air flow and raises the pressure measured at the outlet. A polished surface promotes laminar flow with a resultant lower outlet pressure. The measured outlet pressure provides an analogue to the actual surface finish of the sample being tested.

Figure 24:
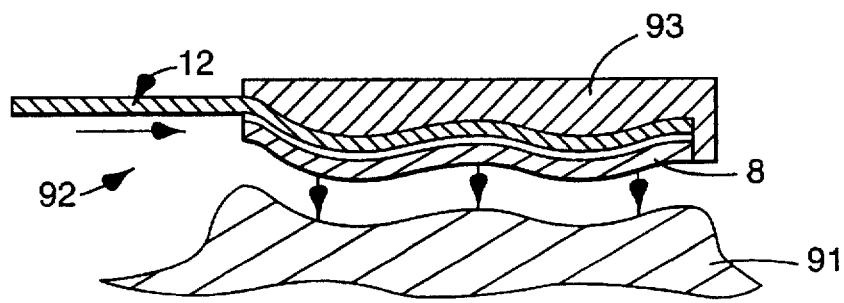
FIGS. 24 and 25 are cross-sectional views of apparatus for handling and operating on an article according to another embodiment of the present invention configured to serve as flexible article applicators.
Figure 25:
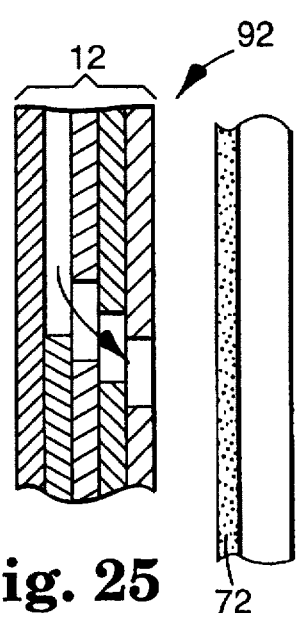

The system 10 also can be used, when attached to the appropriate tooling, as a tape applicator 92 to facilitate the application of tapes to products having complex contours. This is shown in FIG. 24, which depicts decorative tape 8 being applied to a product 91. A length of tape can be cut from a roll, fed into position by the flexible member 12 attached to an application pad 93, and applied to the product by downward movement. In the loading position, the flexible member 12 and pad 93 are lowered to press the tape against the product 91. Application begins at the tape edge and continues across the tape surface until the application is complete to prevent air entrapment. When the tape has been applied, the air supply is deactivated and the flexible member 12 is raised. As the flexible member 12 does not physically contact the tape being transported and applied, adhesive tapes can be transported with the adhesive layer 72 facing the flexible member 12, as shown in FIG. 25.

Figure 26A:
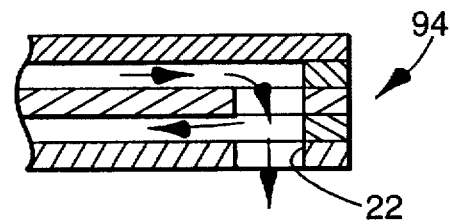
FIGS. 26A, 26B, 27A, 27B, and 28 are cross-sectional views of apparatus according to embodiments of the present invention configured to serve as article and flexible proximity sensors.
Figure 26B:
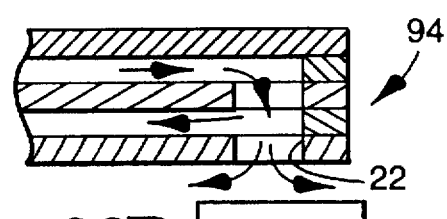
Figure 27A:
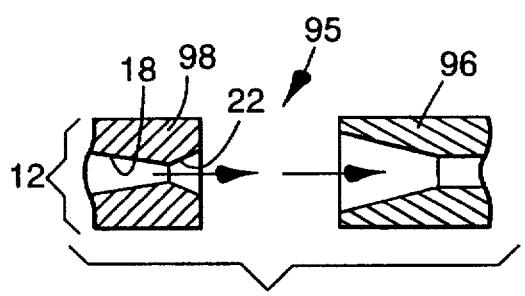
Figure 27B:
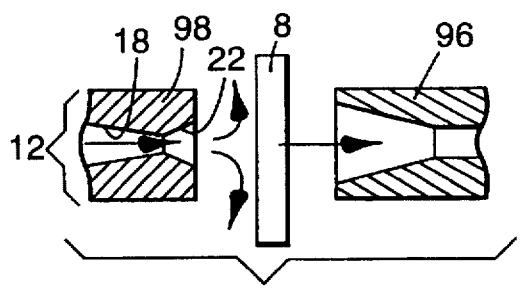
Figure 28:
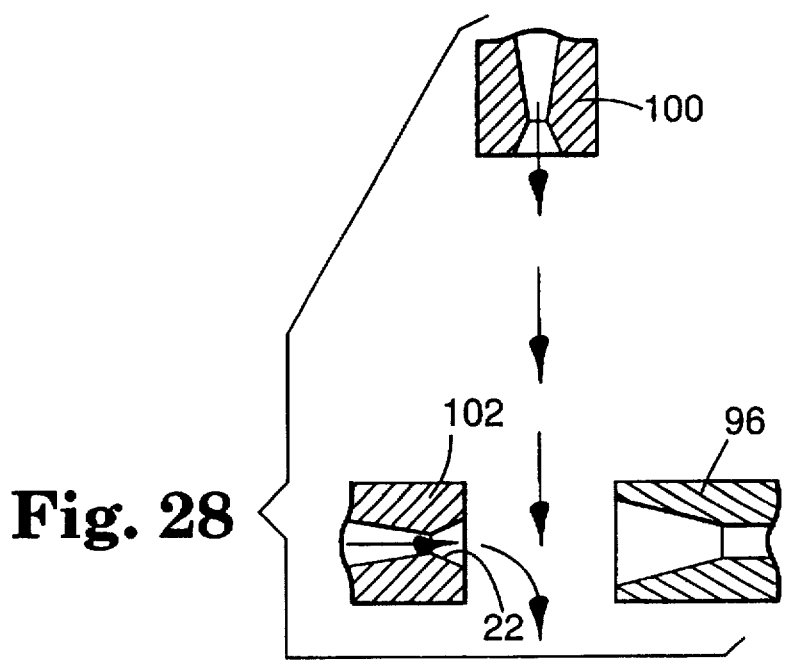
Figure 29B:
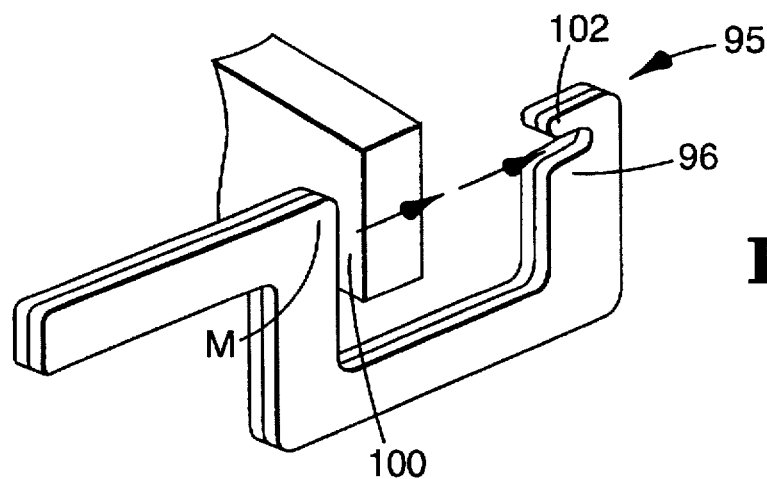
FIG. 29B is a perspective view of an article sensor incorporating the apparatus of FIG. 28.
Figure 29A:
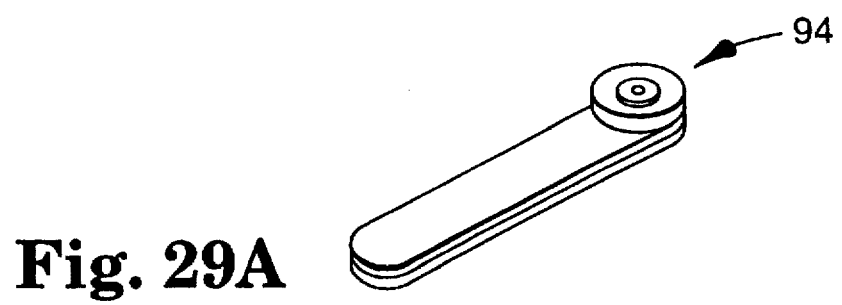
FIG. 29A is a perspective view of an article sensor incorporating the apparatus of FIGS. 26A and 26B.

The operation also has been used to sense the presence of an article 8, as illustrated in FIGS. 26A, 26B, 27A, 27B, 28, 29A, and 29B. FIG. 26A and 26B shows a back pressure article sensor 94. When air exits from the outlet 22 the resultant pressure measured at the control interface near the outlet 22 is low. When an object placed near the outlet impedes flow, the interface pressure increases to signal the presence of the object as shown in FIG. 26B. FIGS. 27A and 27B show an article sensor 45 which operates on an interruptable air flow principle. Two systems are separated by a gap with the orifices on each flexible member oriented to permit fluid exiting the outlets to contact and sense the presence of an article 8 between the systems. The pressure in the receiver system 96 drops when the article 8 is between the sender system 98 and the receiver system 96. In FIG. 28, the range of this interruptable air flow system is increased by using a cross-fire technique. A second sender system 100 ejects air into the stream between the first sender system 102 and the receiver system 96 and the sensing gap extends from the outlet of the second sender system 100 to the sides of the first sender and receiver systems 102, 96. The flow from the second sender system 100 normally diffuses the first sender air flow. When an article 8 is present, the flow from the second sender system 100 is interrupted, and the pressure at the receiver system 96 increases. FIG. 29A is a perspective view of the sensor 94 of FIG. 26A and 26B and FIG. 29B is a perspective view of the sensor 95 of FIGS. 27A and 27B. The sensor body can be attached to an existing surface. A supply manifold in the sensor body provides air flow and a passage sends a pressure build-up signal to a control system when an object is close to the sensing port.

Figure 2:
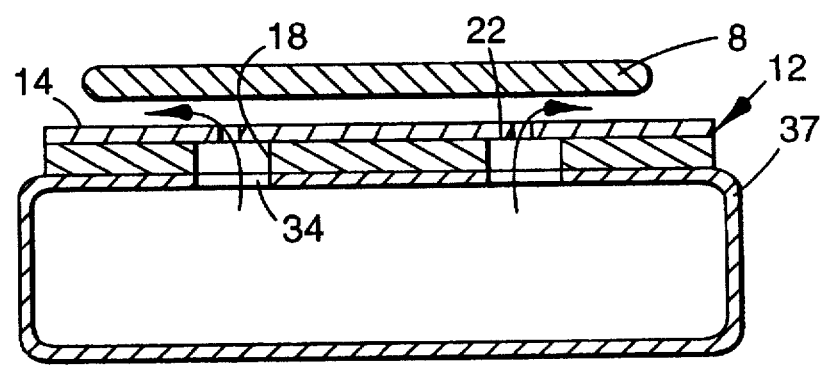
FIG. 2 is an end cross-sectional view of an alternative embodiment of the apparatus of FIGS. 1A, 1B, and 1C.

The system 10 has been used to convert an existing surface into a system for handling and operating on an article 8 by adhering to the existing surface. The converted surface with the system 10 has a thickness that is only slightly thicker than the unconverted surface. Thus, surfaces can be converted inexpensively and quickly. Where the existing surface to be converted is a fluid supply manifold, holes can be formed in the surface of the manifold to communicate with the orifices 18, as shown in FIG. 2.

The method of handling and operating on an article 8 includes the steps of placing the article 8 on the working surface 14 and passing fluid through the orifices 18 to handle and operate on the article 8.

Numerous characteristics, advantages, and embodiments of the invention have been described in detail in the foregoing description with reference to the accompanying drawings. However, the disclosure is illustrative only and the invention is not intended to be limited to the precise embodiments illustrated. Various changes and modifications may be effected therein by one skilled in the art without departing from the scope or spirit of the invention. For example, the layers of the member can be any thickness, and can be so thin that the plurality of layers approximates a solid member with smooth orifices. Also, the openings in the individual layers can have walls that are not perpendicular to the major surfaces of the layers.

We claim:

1. An apparatus for handling and operating on an article comprising a flexible member having a working surface, an opposing surface, and at least one orifice beginning from at least one inlet, passing through the member, and having at least one outlet on the working surface to permit a fluid to enter the member through the inlet and pass through the orifice, wherein the fluid passing through the orifice handles and operates on an article located adjacent the working surface while preventing the article from contacting the working surface, wherein the member is a web comprising a plurality of stacked layers forming a laminate and having major surfaces and connected to each other along the major surfaces, wherein the working surface comprises an outer major surface of one of the stacked layers, wherein the orifice is formed by respective openings in adjacent layers and is nonlinear to create an angular, nonlinear, stepped path for the fluid, and wherein a direction of any fluid that exits the outlet is caused by the angular, nonlinear, stepped path.

2. The apparatus of claim 1, comprising a plurality of the orifices which begin from the at least one inlet.

3. The apparatus of claim 1, further comprising a fluid source connected to the inlet, and means for controlling the fluid from the fluid source to the web and through the web to control the dynamics of the article.

4. The apparatus of claim 1, wherein the orifice is oriented to cause the fluid to exit the orifice through the outlet and wherein the orifice and outlet are configured to orientation independently hold the article adjacent the working surface.

5. The apparatus of claim 1, wherein the orifice is oriented to cause the fluid to exit the orifice through the outlet and wherein the orifice and outlet are configured to transport the article adjacent and along the working surface.

6. The apparatus of claim 1, wherein the orifice is oriented to cause the fluid to exit the orifice through the outlet and wherein the orifice and outlet are configured to rotate the article adjacent the working surface.

7. The apparatus of claim 1, wherein the orifice is configured for the apparatus to serve as a fluidic logic element.

8. The apparatus of claim 1, wherein the orifice is configured for the apparatus to serve as a transducer.

9. The apparatus of claim 1 wherein the outlet extends through the working surface to deliver the fluid to the working surface at an effective angle of less than 20° and has a length-to-width ratio less than 2.9.

10. The apparatus of claim 1 wherein the outlet extends through the working surface to deliver the fluid to the working surface at an effective angle of less than 15° and has a length-to-width ratio less than 3.8.

11. The apparatus of claim 1 wherein the outlet extends through the working surface to deliver the fluid to the working surface at an effective angle of less than 10° and has a length-to-width ratio less than 5.7.

12. The apparatus of claim 1 wherein the outlet extends through the working surface to deliver the fluid to the working surface at an effective angle of less than 5° and has a length-to-width ratio less than 11.4.

13. The apparatus of claim 1 wherein the outlet extends through the working surface along a predetermined path to deliver the fluid to the working surface at an effective angle that permits the article to be transported at speeds of at least 3 m/s.

14. The apparatus of claim 1 wherein when the article is a thin, flexible web and the fluid maintains the web in tension.

15. An apparatus for converting an existing surface into a system for handling and operating on an article comprising a flexible member having a working surface, an opposing surface, and at least one side connecting the working surface and the opposing surface, and at least one orifice beginning from at least one inlet and passing through the member and having an outlet on the working surface to permit a fluid to enter the member through the inlet, and pass through the orifice, and exit through the outlet, wherein the member is a web comprising a plurality of stacked layers forming a laminate, wherein the orifice is formed by respective openings in adjacent layers and is nonlinear to create an angular, nonlinear, stepped path for the fluid, and wherein a direction of the fluid exiting the outlet is caused by the angular, nonlinear, stepped path, and wherein the fluid passing through the orifice handles and operates on an article located on the working surface while preventing the article from contacting the working surface.

16. The apparatus of claim 15, further comprising a fluid source connected to the inlet, and means for transporting the fluid from the fluid source to the web through the apparatus to control the dynamics of the article.

17. The apparatus of claim 16, wherein the transporting means comprises a conduit assembly and wherein the existing surface serves as one wall of the conduit assembly.

18. The apparatus of claim 15, wherein the orifice is oriented to cause the fluid exiting the orifice to create a lower pressure between the article and the working surface than ambient pressure to hold the article adjacent the working surface.

* * * * *